(12) United States Patent　(10) Patent No.:　　US 6,293,814 B1
Tan　　　　　　　　　　　　　　　(45) Date of Patent:　　Sep. 25, 2001

(54) SOCKET CONTACT WITH KELVIN CONTACT FOR TESTING INTEGRATED CIRCUIT DEVICES

(76) Inventor: Yin Leong Tan, Blk. 22, St. George's Road #25-182 (SG)

( * ) Notice: Subject to any disclaimer, the term of this patent is extended or adjusted under 35 U.S.C. 154(b) by 0 days.

(21) Appl. No.: 09/485,355

(22) PCT Filed: Aug. 5, 1998

(86) PCT No.: PCT/SG98/00059

§ 371 Date: May 15, 2000

§ 102(e) Date: May 15, 2000

(87) PCT Pub. No.: WO99/08122

PCT Pub. Date: Feb. 18, 1999

(30) Foreign Application Priority Data

Aug. 7, 1997 (SG) ................................................ 9702818-7

(51) Int. Cl.[7] .................................................... H01R 29/00
(52) U.S. Cl. ........................ 439/188; 439/70; 439/330; 439/515
(58) Field of Search ............................. 439/70, 188, 330, 439/515

(56) References Cited

U.S. PATENT DOCUMENTS 5,245,132 * 9/1993 Luetzow ................................. 174/74

FOREIGN PATENT DOCUMENTS

3176676 * 3/1991 (JP).

* cited by examiner

*Primary Examiner*—Paula Bradley
*Assistant Examiner*—Truc Nguyen
(74) *Attorney, Agent, or Firm*—Jon A. Gibbons; Fleit, Kain, Gibbons, Gutman & Bongini P.L.; Lawrence Y.D. Ho & Associates Pte Ltd.

(57) ABSTRACT

A socket contact with Kelvin contact for the testing of IC devices comprising a plurality of conducting strip sets embedded across a non-conducting base. Each strip set includes two pairs of electrodes. Two pairs of electrodes are designed such that each pair functions to contact one of the two corresponding leads of an IC device. Within the pair, one electrode forms a connection between the IC lead and the tester, and the other electrode provides a Kelvin contact.

10 Claims, 4 Drawing Sheets

SOCKET CONTACT WITH KELVIN CONTACT FOR TESTING INTEGRATED CIRCUIT DEVICES

FIELD OF THE INVENTION

The present invention is a test socket for the testing of integrated circuit devices. In particular, the present invention is a test socket provided with "Kelvin" contacts for testing analog integrated circuit devices.

BACKGROUND OF THE INVENTION

Testing of integrated circuit (IC) devices is an essential part of IC device production. For analog or linear products, voltage drop and current flow are two important parameters that need to be determined in the testing of such products. These two parameters are highly affected by the arrangement of the test circuitry, and the quality of the contact points within the tester. For testing systems that use contact fingers, a set of two contact fingers clamping the IC device leads from the top and bottom allows four-terminal circuit for testing. One pair of contact fingers provides the contact for passing the measurement current, while the other contact finger provides the contacts for measuring the voltage drop at the device under test. This allows the testing system to measure any voltage drift or drop due to resistance within the test lead or due to contact resistance, and adjust the voltage accordingly to provide a constant preset voltage for testing to be performed.

Although contact finger sets provide a four terminal circuit, recent trends have been to shift from testing by contact fingers to testing by test sockets. One important reason is that for each type of IC packaging, a different set of contact fingers have to be manufactured. Adapatition from standard sets is not possible. On the other hand, test sockets have the advantage that they can be adapted by the IC manufacturer to be used for testing their IC packages. Therefore, a wide range of standard sockets can be supplied for testing numerous types of IC devices.

There is, however, no test socket in the market that is provided with Kelvin contacts to allow four-terminal measurements. The main difficult is that this feature requires two pairs of contact points for each pair of corresponding leads of the IC device to be tested. In the case of contact finger sets, the two fingers in each pair contact the IC device lead bi-directionally. Therefore, both the top and bottom surface of the lead is utilized, and there is sufficient room for contact to be made effectively. In the case of a contact socket, however, the testing finger contacts the IC device lead in only one direction from the socket side. Due to the short length of the tip and the small diameter of the IC device lead, conventional thinking has been that it is not feasible to provide a Kelvin contact for testing sockets. In addition to the small surface area that is available for contact with the socket finger, friction during testing results in carbon build up at the contact points of the socket fingers, creating further problems with cross contamination. There is therefore a need to provide a testing socket with Kelvin contacts which can avoid the above-stated pitfalls in practical use.

OBJECT OF THE INVENTION

It is an object of the present invention to provide a testing socket with Kelvin contacts.

It is a further object of the present invention to provide a testing socket which allows a IC packaging tester to input and sense a stable and constant electrical voltage for IC device testing.

SUMMARY OF THE INVENTION

The present invention is a test socket for facilitating the testing of integrated circuit (IC) devices. The test socket is provided with "Kelvin" contacts to allow four-terminal testing. A series of conducting strip sets are embedded across a non-conducting base and aligned juxtaposed to each other. Each strip set includes two pairs of electrodes. Each electrode is electrically insulated from another electrode. Two pairs of electrodes are designed such that each pair functions to contact one of the two corresponding leads of an IC device. Within the pair of electrodes, the first electrode has a tail section, and neck section and a head section, and the second electrode has a receiving end and a body.

The tail section of the first electrode and one end of the body of the second electrode is adapted for electrical connection with a test jig. In the resting position, the head section and the receiving end protrude out of the base adjacent to each other without coming into contact, with the receiving end positioned between the head and the base. The neck section of the first electrode connects the head section with the tail section, and is adapted to providing a resilience to bias the head section away from the receiving end. During testing, an IC device is positioned close to the socket, with the leads pressed against the head section of the first electrode. This results in the compression of the neck section, causing the head section to contact the receiving end. The connection between the receiving end and the head occurs very close to the point of contact between the IC lead and the head. Consequently, a Kelvin contact is achieved by passing the measurement voltage in one electrode, and measuring the voltage drop at the IC device on the other electrode.

DETAILED DESCRIPTION OF THE INVENTION

The present invention is a test socket provided with an extra pair of electrodes which allows Kelvin contact to be made to reduce measurement errors during the testing of IC devices. This socket is provided with two pairs of electrodes for each IC device lead. Due to the small surface area available on the lead of an IC device for contact, even if the electrodes could be made small enough to provide two separate contact points per lead, the distance separating the contact surfaces of the electrodes would have to be very short if both electrodes were to be able to maintain sufficient contact with the lead during testing. Friction occurring during contact with the lead causes the lead soldering on the lead to scrape off, contaminating the contact points. This results in at least three problems. The first problem is that different levels of carbon build up would occur on the two contact surfaces, resulting in different resistance build up. As a result, the pair of pins, which needs to be equivalent to provide an effective Kelvin contact, would be unequally contaminated soon after use, and would no longer serve their intended function. Another problem, caused by the short distance between the two contact points, is that carbon build up might actually cause the two surfaces to be connected with an unknown surface area, causing instability in the electrical parameters. A third important problem is that scratching of the lead surface is aggravated if the lead is pressed against two very small electrodes, as the pressure is concentrated on a small surface area. As a result, producing a socket with Kelvin contact has been considered impractical.

The solution to the problem lies in designing a pair of electrodes such that only the first electrode actually touches the lead, while the second electrode is allowed to connect to the first electrode during testing. Most preferably, this testing connection is at a point very close to the contact point between the IC device lead and the first electrode. One embodiment of achieving this configuration is to provide a flat head in the first electrode, with one side of the flat surface adapted for contact with the lead, and the opposite side adapted for contact with the receiving end of the second electrode.

Figure 1:
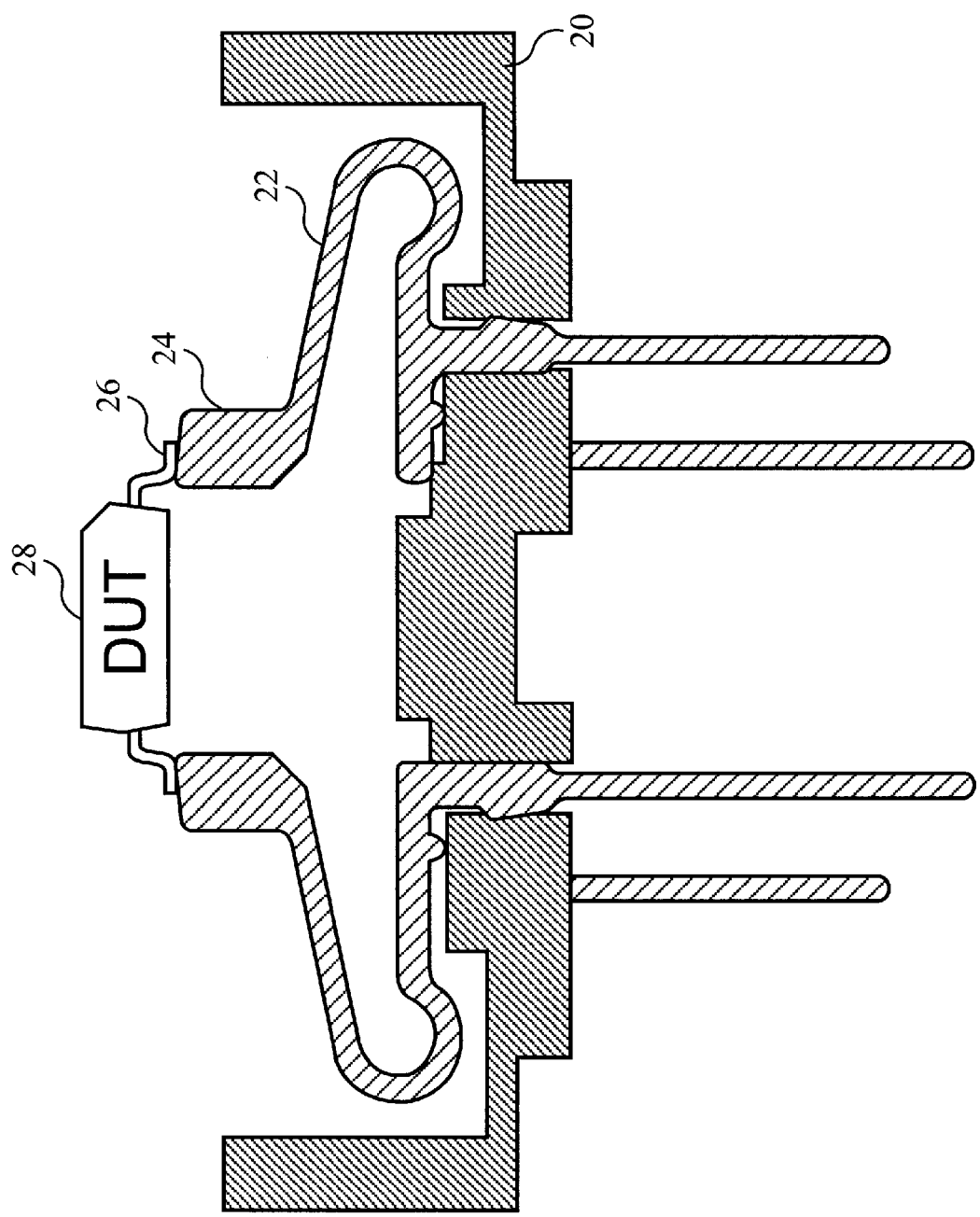
FIG. 1 is a cross sectional view of a test socket in the prior art.
Figure 2:
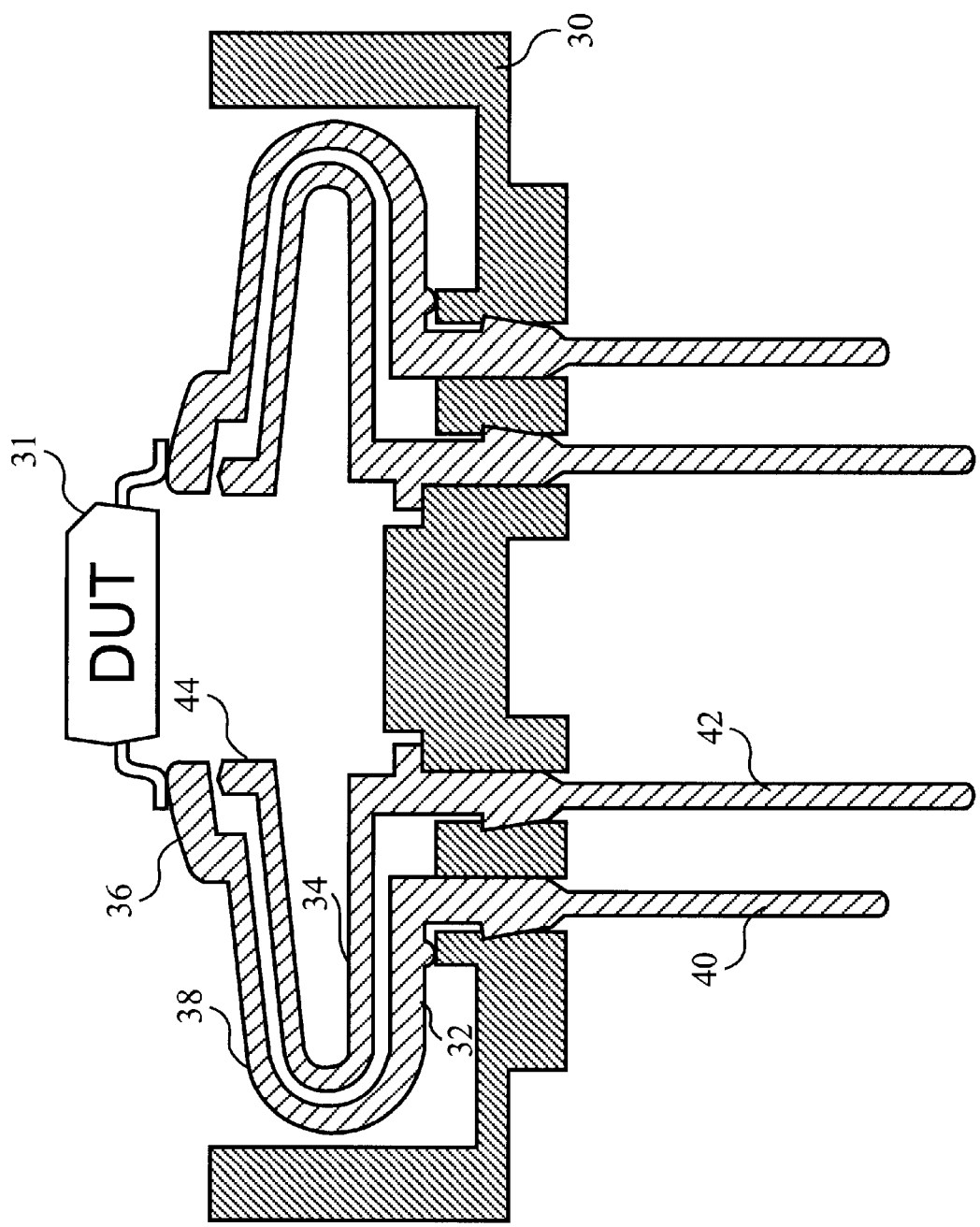
FIG. 2 is a cross sectional view of a test socket in the resting position in accordance with the present invention.
Figure 3:
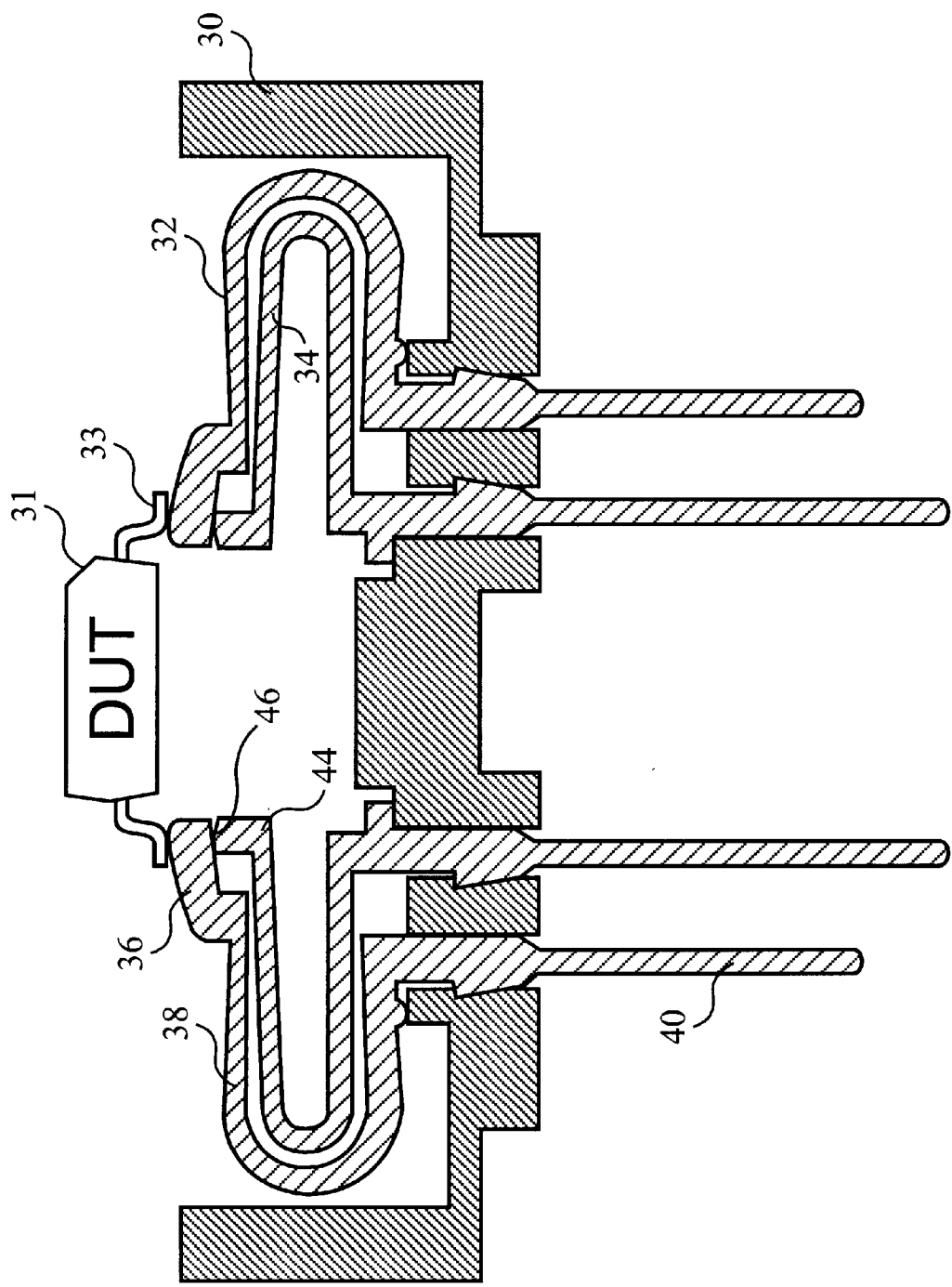
FIG. 3 is a cross sectional view of a test socket in the test position in accordance with the present invention.

While the present invention has been described particularly with references to FIGS. 1 to 3, it should be understood that the figures are for illustration only and should not be taken as limitation on the invention. It is contemplated that many changes and modifications may be made by one of ordinary skill in the art without departing from the spirit and the scope of the invention described.

FIG. 1 shows a cross-sectional view of a test socket found in the prior art. The socket includes a series of metallic strips embedded in a non-conducting base 20. The strips act as electrodes and are arranged in two rows such that the contact surface 24 of each electrode 22 is aligned with the lead 26 of the IC device 28 to be tested, the other end of the strip is adapted for connection with the test jig. There is only a single electrode for each lead, with no Kelvin contact.

FIG. 2 shows a socket in accordance with the present invention. This socket is provided with a non-conducting base 30 and a pair of metallic electrodes for contact with each lead of a IC device 31. the first electrode 32 and the second electrode 34 are both embedded in the base. In FIG. 2, only a portion of the base is shown to allow clearer illustration of the configuration of the electrodes. Another pair of electrodes are found in a mirror image configuration opposite the first pair for connection with the corresponding lead on the other side of the IC device. Each electrode is electrically insulated from each other.

The first electrode 32 in FIG. 2 includes a head section 36, a neck section 38 and a tail section 40. The second electrode 34 contains a body section 42 connected to a receiving end 44. The tail section 40 of the first electrode is formed into a thin rod to facilitate connection with the test jig 43. The body of the second pin also comprises a tail, and has a structure and function similar to the tail section of the first electrode. The head section of the first electrode is preferably formed into a flat tongue shape to provide maximum surface area for contact with the lead of the IC device to be tested. The head section is joined to the tail section of the first electrode via the neck section 38. The neck section is shaped to provide a spring force to bias the head section away from the receiving end of the second electrode. This allows the first and second electrode to be electrically disconnected and an open circuit is maintained in the resting position. This is an important feature as its is a standard testing requirement to do pin-to-pin short circuit testing.

In the testing mode as shown in FIG. 3, an IC device is placed next to the test socket with each lead 33 of the IC device in contact with one head section 36 of one lead. A gentle pressure is applied on the lead to press the lead into firm contact with the head section of the first electrode as shown in the direction of the arrows in FIG. 3. This pressure also compresses the springy neck section 38, and causes the head to come into effective contact with the receiving end 44 of the second electrode at surface 46. These contact surfaces are adapted to form good electrical contacts. The head section and the receiving end are preferably gold plated to prevent oxidation. The head section is preferably formed into a flat tongue structure to minimize the distance between the lead and the receiving end when testing is in progress, and to maximize the area of the contact surface.

Figure 4:
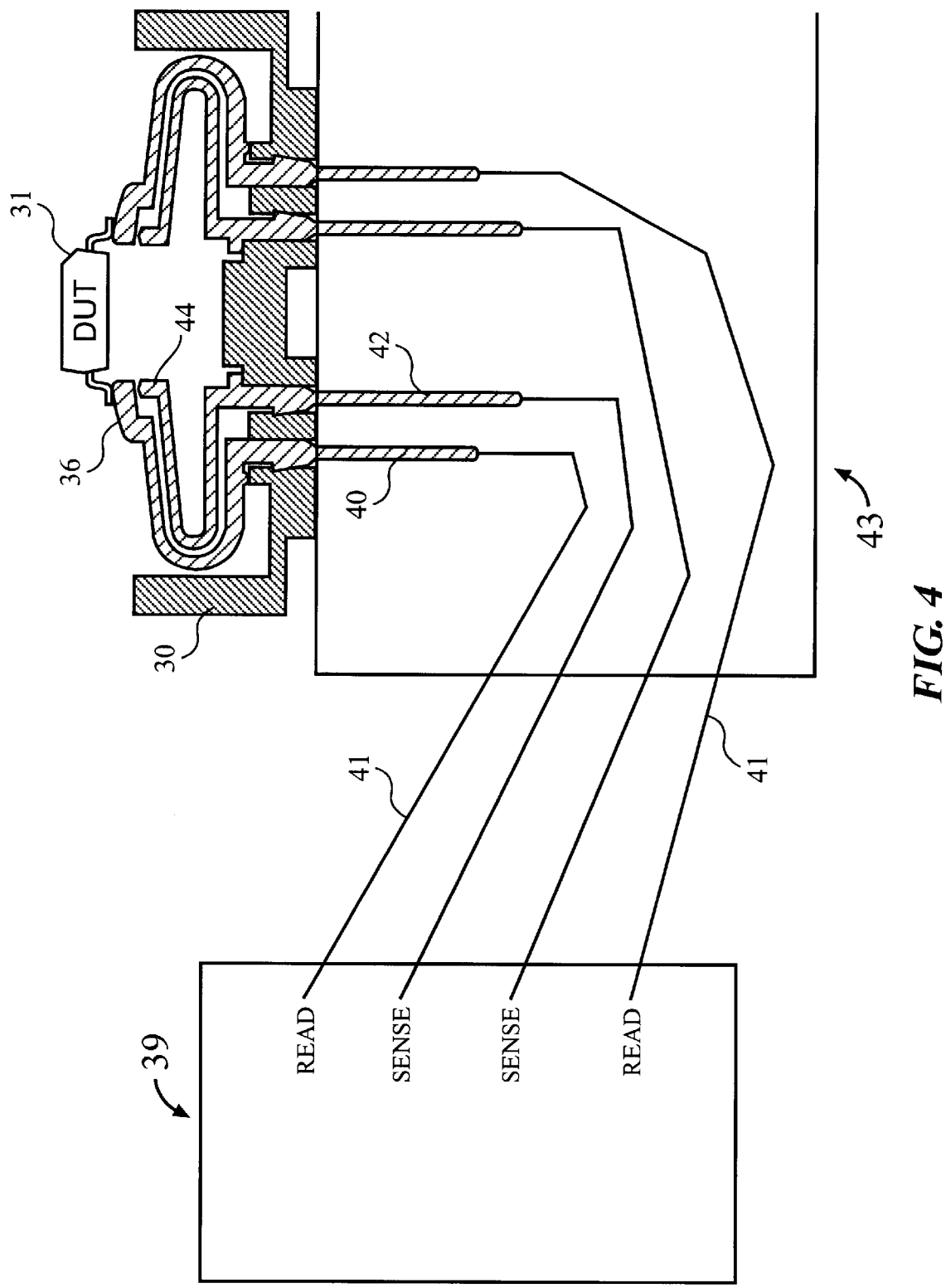
FIG. 4 is a schematic diagram to show the interconnection between the device under test and the tester.

FIG. 4 shows one embodiment in which the socket is used for IC device testing. In this example, the electrodes are connected to the tester 39 via electrical conducting wire 41. When a current is sent across the IC device through the first electrode, resistance between the first electrode and the electrical conductor wire from tester can be measured reliably using this test socket with Kelvin contacts.

I claim:

1. A contact socket with Kelvin contact for facilitating a testing of integrated circuit device comprising:

an electrically non-conducting base for attachment of said contact socket to a test jig;

a plurality of electrically conducting strip sets embedded across said base, each strip set comprising, a first electrode with a tail section, a neck section, and a head section, said tail section adapted for electrical connection with said test jig, said head section protruding from said base and adapted for contact with a lead of said integrated circuit device, said neck section connecting said tail section with said head section; and a second electrode, having a body connected to a receiving end, wherein in a resting position, said receiving end is electrically disconnected from said head section, but in a testing position, said receiving end is electrically connected to said head section.

2. A contact socket according to claim 1 wherein said neck section is made of a resilient material to bias said head section away from said receiving end in the resting position, and to compress when under pressure to make electrical contact between said head section and said receiving end.

3. A contact socket according to claim 1, wherein said contact socket comprises a pair of strip sets in mirror images of each other, each strip set positioned to contact a corresponding lead of said integrated circuit device.

4. A contact socket according to claim 2, wherein said contact socket comprises a pair of strip sets in mirror images of each other, each strip set positioned to contact a corresponding lead of said integrated circuit device.

5. A contact socket according to claim 1 wherein said head section of said first electrode and said receiving end of said second electrode are gold plated.

6. A contact socket according to claim 2 wherein said head section of said first electrode and said receiving end of said second electrode are gold plated.

7. A contact socket according to claim 1 wherein said head section and said receiving end are flat, such that a distance between the lead of the device under testing and the receiving end is maintained.

8. A contact socket according to claim 2 wherein said head section and said receiving end are flat, such that a distance between the lead of the device under testing and the receiving is minimized.

9. A contact socket according to claim 1 wherein said integrated circuit device is of the linear type.

10. A contact socket according to claim 2 wherein said integrated circuit device is of the linear type.

* * * * *